(12) United States Patent
Arnold

(10) Patent No.: US 6,833,031 B2
(45) Date of Patent: Dec. 21, 2004

(54) METHOD AND DEVICE FOR COATING A SUBSTRATE

(75) Inventor: Rocky R. Arnold, San Carlos, CA (US)

(73) Assignee: Wavezero, Inc., Sunnyvale, CA (US)

( * ) Notice: Subject to any disclaimer, the term of this patent is extended or adjusted under 35 U.S.C. 154(b) by 83 days.

(21) Appl. No.: 09/812,075

(22) Filed: Mar. 19, 2001

(65) Prior Publication Data

US 2002/0002945 A1 Jan. 10, 2002

Related U.S. Application Data

(60) Provisional application No. 60/190,920, filed on Mar. 21, 2000, and provisional application No. 60/198,777, filed on Apr. 21, 2000.

(51) Int. Cl.[7] .......................... C23C 16/00; C25B 11/00
(52) U.S. Cl. ...................... 118/718; 118/719; 118/726; 118/724; 118/44; 204/298.24; 204/298.25
(58) Field of Search ................................. 118/719, 724, 118/718; 204/298.24; 174/35 R

(56) References Cited

U.S. PATENT DOCUMENTS

| | | | | |
|---|---|---|---|---|
| 2,000,077 A | * | 5/1935 | Harshberger | 427/188 |
| 2,157,944 A | * | 5/1939 | Walton | 427/188 |
| 3,616,451 A | * | 10/1971 | Gallez | 204/298.26 |
| 3,756,939 A | * | 9/1973 | Hurwitt | 204/298.12 |
| 3,793,063 A | * | 2/1974 | Wiley | 204/192.1 |
| 3,852,181 A | | 12/1974 | Cirkler et al. | |
| 4,102,964 A | * | 7/1978 | Ridgeway | 264/511 |
| 4,250,604 A | * | 2/1981 | Utner et al. | 29/25.42 |
| 4,261,808 A | | 4/1981 | Walter | |
| 4,342,631 A | * | 8/1982 | White et al. | 427/524 |
| 4,955,341 A | * | 9/1990 | Trombley et al. | 123/305 |
| 5,053,252 A | * | 10/1991 | Kimura et al. | 427/164 |
| 5,076,203 A | | 12/1991 | Vaidya et al. | |
| 5,088,444 A | | 2/1992 | Ohmine et al. | |
| 5,112,466 A | * | 5/1992 | Ohta et al. | 204/298.05 |
| 5,296,036 A | * | 3/1994 | Matsuyama et al. | 118/718 |
| 5,364,481 A | * | 11/1994 | Sasaki et al. | 118/718 |
| 5,536,322 A | * | 7/1996 | Wary et al. | 118/719 |
| 5,565,248 A | | 10/1996 | Plester et al. | |
| 5,605,637 A | * | 2/1997 | Shan et al. | 216/71 |
| 5,672,255 A | | 9/1997 | Hamada et al. | |
| 5,811,050 A | | 9/1998 | Gabower | |
| 5,861,062 A | * | 1/1999 | Reiss | 118/326 |
| 5,908,506 A | | 6/1999 | Olson et al. | |
| 5,975,745 A | * | 11/1999 | Oishi et al. | 700/167 |
| 6,047,660 A | | 4/2000 | Lee | |
| 6,113,752 A | * | 9/2000 | Hollstein | 204/192.12 |
| 6,113,753 A | * | 9/2000 | Washburn | 204/192.15 |
| 6,127,038 A | | 10/2000 | McCullough et al. | |
| 6,157,548 A | * | 12/2000 | Collins et al. | 361/818 |
| 6,271,465 B1 | * | 8/2001 | Lacey | 174/35 R |
| 6,470,650 B1 | * | 10/2002 | Lohwasser | 53/453 |
| 2002/0046849 A1 | * | 4/2002 | Rapp et al. | 174/35 R |

FOREIGN PATENT DOCUMENTS

| | | | | | |
|---|---|---|---|---|---|
| EP | 405164 A2 | * | 1/1991 | .......... | B05B/13/00 |
| JP | 08311649 A | * | 11/1996 | .......... | C23C/14/54 |
| JP | 10168576 A | * | 6/1998 | .......... | C23C/16/50 |

* cited by examiner

Primary Examiner—Parviz Hassanzadeh
Assistant Examiner—Karla Moore
(74) Attorney, Agent, or Firm—Townsend and Townsend and Crew LLP

(57) ABSTRACT

Apparatus and methods for coating a substrate. In an exemplary embodiment, the apparatus are used to create a metallized substrate for use as an EMI/RFI shield. The apparatus typically includes a movable processing apparatus that is movable orthogonal to the substrate to treat the substrate. The processing apparatus can include a surface preparation assembly, a heating assembly, a thermoforming assembly, a metallizing assembly, a cutting assembly, or the like.

23 Claims, 7 Drawing Sheets

Section C-C

METHOD AND DEVICE FOR COATING A SUBSTRATE

CROSS REFERENCES TO RELATED APPLICATIONS

The present application claims benefit, under 37 C.F.R. § 1.78, of provisional patent application Ser. No. 60/190,920, filed Mar. 21, 2000 and provisional patent application Ser. No. 60/198,777, filed Apr. 21, 2000, the complete disclosures of which are incorporated herein by reference.

BACKGROUND OF THE INVENTION

The present invention relates generally to methods and systems for coating a substrate. More particularly, the present invention relates to methods and devices for depositing a metal layer onto a thermoform that is of a sufficient thickness for shielding of electromagnetic interference ("EMI") and radiofequency interference ("RFI").

U.S. Pat. No. 5,811,050 to Gabower, which is incorporated herein by reference, has proposed depositing a thin layer of metal onto a thermoform to create a protective barrier for EMI and RFI. One method for depositing the metal layer onto the thermoform is a batch mode process. A first step of the method includes thermoforming (i.e. shaping) the thermoform substrate. The shaped thermoforms are then placed into the vacuum chamber and a vacuum source is used to create a vacuum in the chamber. A source of metal is vaporized and deposited onto the thermoform substrate.

Unfortunately, the batch processes is slow, time consuming, and impurities can be introduced into the metallized object during transport into and out of the vacuum chamber. For example, one specific problem with the batch process is the creation of the vacuum environment in the deposition chamber. Because the vacuum chamber usually has a large volume (typically about 300,000 in$^3$), the creation of the vacuum environment takes a long period of time to create. Another problem of batch processing is that the thermoform must be separately shaped and cut from the thermoform sheet and it is often necessary to manually handle the thermoformed substrate, both prior and subsequent to the coating process. Care must be taken in such handling steps to avoid contamination or introduction of impurities which may lead to imperfections in the metal layer and leakage in the EMI/RFI shield.

Therefore, what is needed are vapor deposition processes and apparatuses for coating objects with a coating material that have improved process speed and improved process control characteristics.

DESCRIPTION OF BACKGROUND ART

U.S. Pat. No. 5,908,506 provides a continuous vapor deposition apparatus that appears to have stationary process chambers. U.S. Pat. No. 5,811,050 describes an apparatus for vacuum depositing a metallic coating on thermoformed blanks that are placed on a carrier that revolves around a stationary tungsten filament. U.S. Pat. No. 5,076,203 recites passing a web over spools past a stationary source of metal and an electron beam heater. U.S. Pat. No. 4,261,808 describes a vertical vacuum coating apparatus that deposits a metal layer onto a moving substrate with a fixed cathode system.

SUMMARY OF THE INVENTION

The present invention provides improved methods and systems for depositing a coating material onto a substrate. In exemplary embodiments, the methods and systems are used for vacuum metallizing a thermoform or other substrate for creating an EMI/RFI shield.

The systems of the present invention generally have at least one processing apparatus that is movable orthogonal to a plane of the substrate. The processing apparatus can be moved adjacent the substrate or to contact the substrate, a platform, and/or a second processing apparatus to process the substrate. In some embodiments, the processing apparatuses have a small volume cavity in which a vacuum can be created for the delivery of a vaporized metal or other coating material. The small vacuum cavities of the processing apparatuses of the present invention allow a vacuum source to create a vacuum environment in a shorter amount of time than conventional vacuum chambers, thus improving the speed of manufacturing of the substrates. The cavities of the processing apparatuses can house a shaping assembly, a pre-treatment assembly (e.g. glow discharge), a metallizing assembly (e.g. vacuum metallization, arc plasma deposition, ion deposition), heating elements, a cutting assembly or the like.

In some configurations, the systems of the present invention are configured as in-line system that has a plurality of movable processing apparatuses. Advantageously, the in-line systems of the present invention allow for the processing of spools or rolls of a substrate, such as a thermoform, such that no manual handling of the thermoform is required in intermediate steps. The processing apparatuses can be configured to thermoform, pre-treat the substrate, metallize and/or cut the thermoform using the single in-line system.

The substrate may enter into the processing area either as a structural form which has been subject to prior processing (referred to as thermoforming) or the substrate may enter the processing area as a flat substrate and be subject to thermoforming followed by metallization, or alternatively vacuum metallization followed by thermoforming. For example, in some exemplary embodiments, the systems of the present invention include a series of movable processing apparatuses on one or both sides of the substrate. The assemblies can all be adapted to perform the same function (e.g. metallize) or each of the processing apparatuses can perform different functions (e.g., thermoform, metallize and cut). For example, for one exemplary in-line system, the substrate can be moved to a first processing apparatus for shaping (e.g., thermoforming) of the substrate. The shaped substrate can be then be moved to a second processing apparatus which can deposit a metal layer onto the shaped substrate (e.g., vacuum metallization). Finally, the shaped and metallized substrate can be transported to a third processing apparatus that can cut the shaped and metallized form out of the substrate. It should be appreciated that additional processing apparatuses can also be incorporated into the previous example, such as surface treatment apparatuses, heating apparatuses, or the like.

In some exemplary configurations, the processing apparatuses of the present invention can include one or more modular units for providing multiple interfaces for processing the substrate. Such processing apparatuses will be movable orthogonal to the plane of the substrate and rotatable so that a desired processing interface of the modular units can be moved into position to process the substrate. Such a configuration allows for a multitude of processes to be accomplished either on a single sheet of material or as a part of a continuous inline process in which a polymer or flexible film is unrolled and processed from beginning to end.

Typically, each processing apparatus includes at least three modular units, and preferably between three and six modular units. Each modular unit of each processing apparatus can have the same or different functions. For example, in some processing apparatuses each of the modular units will have the same modular unit, for example a metallization unit. The metallization unit will be used deposit a metal layer onto the substrate. Once the metal source has been depleted in the metallization unit, the processing apparatus can be rotated and a metallization unit having a full metal source can be used. Once the depleted metal source has been rotated away, the metal source can be manually or mechanically replaced. Such a configuration limits the "down time" of the system and improves the output and production of the system.

Alternatively, each of the modular units of the processing apparatus can have a different functional modular unit. For example, a first modular unit can be used to heat the thermoform. The first modular unit can be rotated away and a second shaping modular unit can process and shape the substrate. Thereafter, the next modular units, such as a surface treatment assembly, metallization assembly, and cutting assembly modular unit can be rotated towards the substrate to process the substrate. Advantageously, if desired the rotatable, modular processing apparatuses allow for multiple or complete processing of the substrate while maintaining the position of a substrate in a single position. Such systems can reduce the footprint of the system on the manufacturing floor.

In exemplary embodiments, the present invention can create EMI/RFI shields that can be used within electronic devices and products to reduce the amount of electromagnetic radiation that is emitted from and enters the electronic device. In an exemplary embodiment, the EMI RFI shields enabled by the equipment described above are based upon the application of a relatively stable and uniform layer of aluminum on a polymer substrate. The present invention can apply any number of different metal layers (e.g., silver, copper, gold, nickel, or the like) to any number of substrate materials (e.g., polycarbonate, ABS, PVC, or the like) through a variety of metallization processes.

In one aspect, the present invention provides an apparatus for coating a substrate. The apparatus comprises a support that supports the substrate and at least one movable processing apparatus that can deposit a metal layer onto the substrate. The processing apparatus is movable between a first position adjacent the substrate and a second position apart from the substrate.

In another aspect, the present invention provides an apparatus for metallizing a substrate. The apparatus comprises a support that can maintain at least a portion of the substrate along a first plane and at least one rotatable processing apparatus that is movable substantially orthogonal to the orientation of the substrate. The processing apparatus comprises a plurality of modular units that includes at least one of a thermoform assembly, a heating assembly, a metallizing assembly, or a cutting assembly.

In another aspect, the present invention provides an in-line apparatus for creating an EMI shield, the apparatus comprises a conveyor assembly that moves a substrate from a first position to a second position and a movable shaping chamber disposed at the first position to shape the substrate. A metallization chamber can create a seal around the shaped substrate and can deposit a metal layer onto the shaped substrate, and a cutting assembly disposed at the second position to cut the shaped substrate, the cutting assembly being movable relative to the shaped substrate.

In yet another aspect, the present invention provides a method of manufacturing an EMI shield. The method comprises positioning a substrate on a support. A processing apparatus is moved adjacent to the substrate, a metal layer is deposited on the substrate and the processing apparatus is moved away from the substrate.

For a further understanding of the nature and advantages of the invention, reference should be made to the following description taken in conjunction with the accompanying drawings.

DESCRIPTION OF THE SPECIFIC EMBODIMENTS

The present invention provides improved systems and methods for depositing a metal layer onto a shaped polymer substrate. In exemplary embodiment, the systems of the present invention rely on the use of at least one movable processing apparatus to treat a substrate. Treatments can include surface treatment, preheating, shaping, depositing a metal layer, cutting, or the like.

In a specific use, the methods and systems of the present invention are for use in producing EMI/RFI shields for electronic devices. In particular, the final EMI/RFI shields are composed of a metallized thermoform that are manufactured with the processes and systems of the present invention. In most embodiments, the systems of the present invention include at least one movable processing apparatus, and typically a first processing apparatus disposed on a first side of the substrate and a second processing apparatus disposed on a second side of the substrate. Such a configuration helps in the efficient treatment of both sides of the substrate. For example, in the embodiments in which the processing apparatus shapes the substrate, the first processing apparatus can include a mold while the second side can include a corresponding mold to shape the substrate. Moreover, if the processing apparatus is used to deposit a metal layer onto the substrate, both the first and second processing apparatus can be used so as to metallize both sides of the substrate.

While the remaining discussion will focus on an in-line process for thermoforming, metallizing, and cutting a polymer substrate to create an EMI/RFI shield, it should be appreciated that the apparatuses of the present invention can be adapted to perform only a single process of the processing of the substrate. For example, the apparatuses of the present invention can be used to only metallize flat substrates. Alternatively, the apparatuses of the present invention can be used to only shape (e.g., thermoform) the substrate. Additionally, the apparatus does not have to be an in-line process, but instead the processing apparatus can be a stand alone device that allows a user to manually position the substrate in a processing position. Finally, it should also be appreciated that the methods and systems of the present invention can also extend to depositing a coating on any type of substrate.

Figure 1:
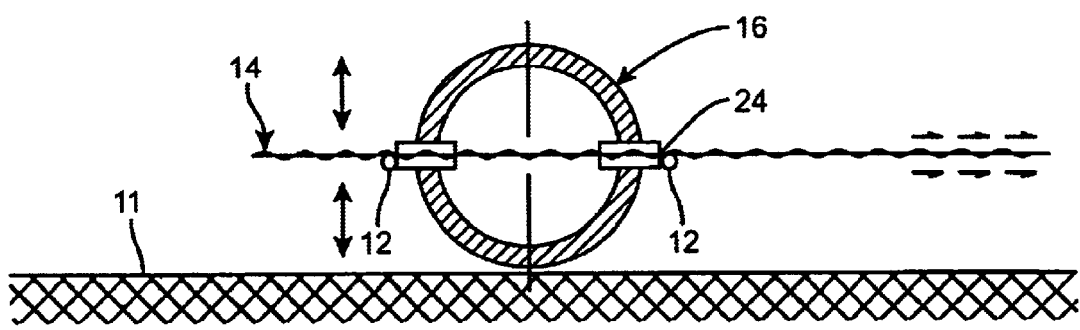
FIG. 1 is a simplified cross sectional view of a processing apparatus of the present invention.

Referring now to FIG. 1, one exemplary system 10 of the present invention includes a housing 11 having a support 12 that can position a substrate 14 adjacent at least one processing apparatus 16. The processing apparatus is movable relative to the substrate 14 and will typically be movable orthogonal from the substrate 14 when the substrate is positioned on the support 12 (i.e. up/down in the case of a vertical application or forward/back in the case of a horizontal application.).

Figure 2:
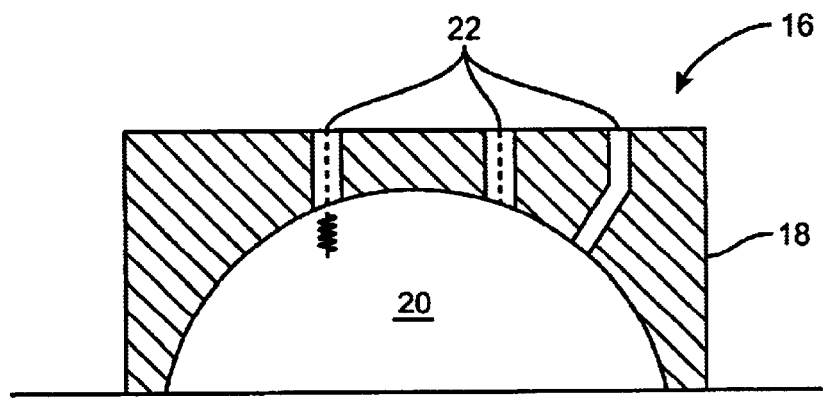
FIG. 2 is a cross sectional view of a simplified exemplary processing apparatus of the present invention.

As illustrated in FIG. 2, each of the processing apparatus 16 typically includes a body 18 that defines a cavity 20. The body typically has at least one conduit 22 for delivering a gas, creating a vacuum, delivering electrical energy to the cavity, or the like. As the processing apparatus 16 moves adjacent the substrate 14, some processing apparatuses can contact the support 12, the substrate 14 and/or a platform 24 (FIG. 1) to provide a seal around the target portion of the substrate 14. Thereafter, if desired, a vacuum can be created around the target portion of the substrate 14 prior to a delivery of a metal onto the substrate. The cavity 20 typically will have a volume of approximately 16,000 in$^3$. In contrast, standard vacuum chambers will have a total volume of almost 300,000 in$^3$. Because the cavity has a smaller volume than conventional vacuum chambers, a vacuum can be created quicker and the processing of the substrate can be completed faster. It should be appreciated however, that the size of the body 18 and cavity 20 can be varied to allow for different sized substrates and different processing speeds. Additionally, not all processes of the present invention require a creation of a vacuum. For example, if the processing apparatus 16 is used to shape the substrate the body 18, the processing apparatus may not have a cavity and a vacuum may not be created around the substrate.

Figure 3:
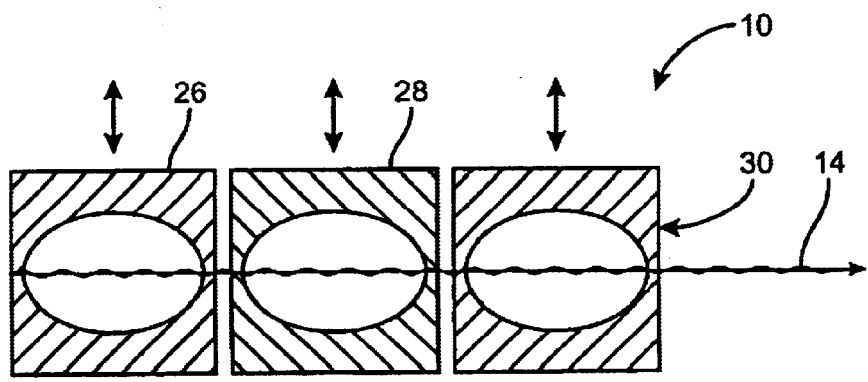
FIG. 3 is a simplified view of a system comprising a plurality of processing apparatuses in which the processing apparatuses are disposed on both sides of a substrate.

FIG. 3 illustrates another embodiment of the system of the present invention. The system 10 can includes a plurality of stations for treating the substrate 14. In the illustrated embodiment, the system 10 can include a shaping station 26, a metallization station 28, and a cutting station 30. Optionally, a conveyor support 32 can be incorporated into the system to transport the substrate 14 from station to station. It should be appreciated however, that any number of stations can be provided, and the stations can be positioned in any order desired. For example, instead of having each station perform a different function, each of the stations can be configured to deposit a metal layer onto the substrate 14. Because each of the vacuum cavities has a smaller volume than conventional vacuum chambers, a vacuum can be created around the substrate quicker than conventional vacuum chambers and the entire substrate can be metallized in a shorter period of time.

Figure 4:
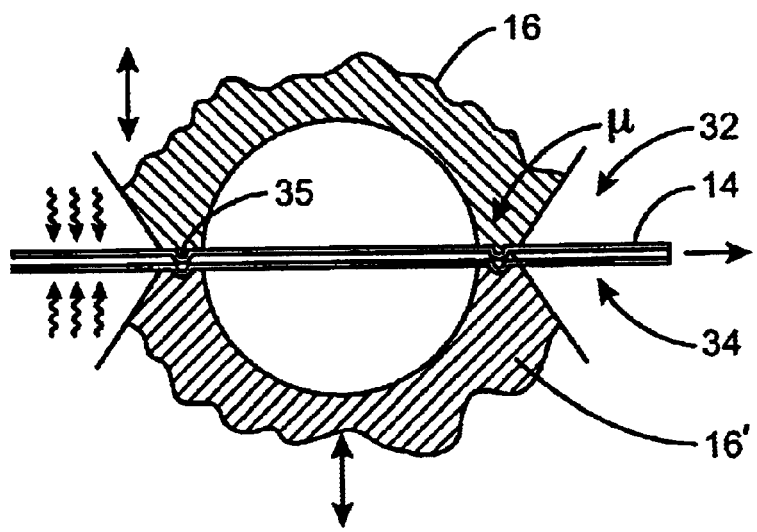
FIG. 4 is a partial cross sectional view of a first and second processing apparatus.

As shown in FIG. 4, exemplary stations include a first unit 16 positioned on a first side 32 of the substrate and a second unit 16' positioned on a second side 34 of the substrate. The units 16, 16' will work in tandem to process the substrate so that when the units are moved adjacent the substrate, each of the units can simultaneously process both sides of the substrate. For example, while not shown, the first unit 16 and second unit 16' can have complimentary sides of a mold for shaping the substrate. The first and second units will press the substrate to shape the substrate. The first and second units can employ a heating element, a vacuum and/or air pressure to facilitate forming of the substrate (not shown). The next station can be used to deposit the metal layer onto the shaped substrate 14. The first and second units can contact the body 18, the substrate 14, and/or each other with contact points 35 to create a vacuum around the shaped substrate. The contact points can include aligned protrusions and detents to create additional pressure on the substrate to prevent the leakage of air into the chamber. Thereafter, a vacuum source (not shown) can create a vacuum in the cavity 20 and the metal layer can be deposited on one or two sides of the shaped substrate. Next, the shaped and metallized substrate can be transported to the third station where the shaped substrate will be at least partially cut away from the remaining portion of the substrate with the first and second units. The first and second units can include a cutting assembly (not shown) that contacts the substrate to cut the shaped portion of the substrate off of the remainder of the substrate.

Figure 5:
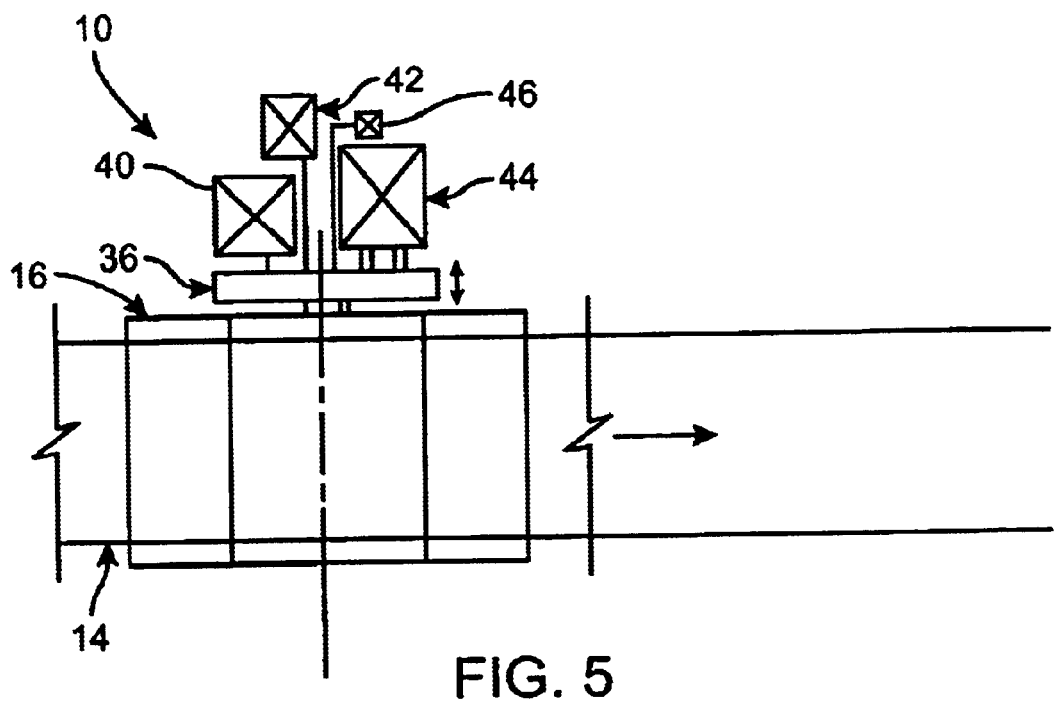
FIG. 5 is a simplified top view of a system of the present invention.

FIG. 5 illustrates one representative system 10 of the present invention. The substrate 14 is shown as a film roll moving from left to right and between the first and second units 16. The first and second units are connectable to a movable end unit 36 that provides an interface with fixed equipment. The end unit 36 can be connected to a source of electrical power 40, a gas unit 42 which houses various types of gases used in processing of the substrate, a vacuum unit 44 which contains various types of pumps, blowers, valves, or the like, necessary to effect and release vacuum and sources 46 of other types of processing materials like liquids or gases used to create positive pressure for some thermoforming operations. The connections between the various units are accomplished with suitably designed and conventional mechanical quick connect/disconnect fittings and movable hoses and cables. The systems of the present invention generally include a computer control system (not shown) to control the movement of the processing apparatuses, the end unit, the substrates, and the like.

Exemplary rotatable processing apparatuses of the present invention are illustrated in FIG. 6 to FIG. 19. The processing apparatuses 16 can include a plurality of modular units 50 such that rotation of the processing apparatuses 16 allows a different modular unit to be moved adjacent or into contact with the substrate. Such an assembly allows the processing apparatus to perform a different process (or the same process) to the substrate 14 using only a single processing apparatus.

Figure 6:
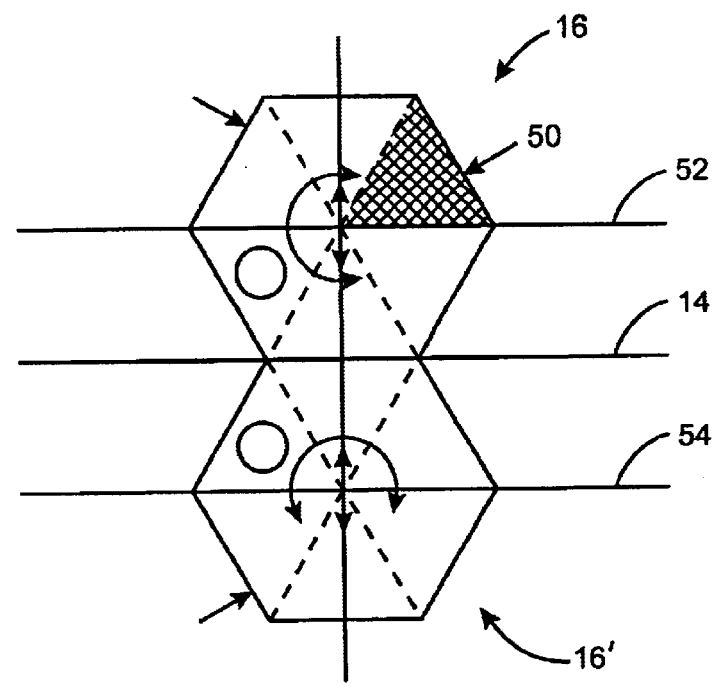
FIG. 6 is an end view of an upper and lower processing apparatus.

As illustrated in FIG. 6, the substrate 14 can be positioned between the first and second apparatuses 16, 16' in a direction substantially parallel to both a first unit centerline 52 and second unit centerline 54. The substrate 14 is typically composed of a nominally planar layer of material such as a metal, polymer, ceramic, or the like. The first and second unit 16, 16' can rotate clockwise or counterclockwise independently of one another and can also move in a direction that is orthogonal to the substrate plane. Movement of the first and second processing units towards the substrate by the first and second units 16, 16' leads to contact with the substrate and the creation of an isolated area on the substrate where various processes can be performed on the substrate.

Figures 7A, 7B:
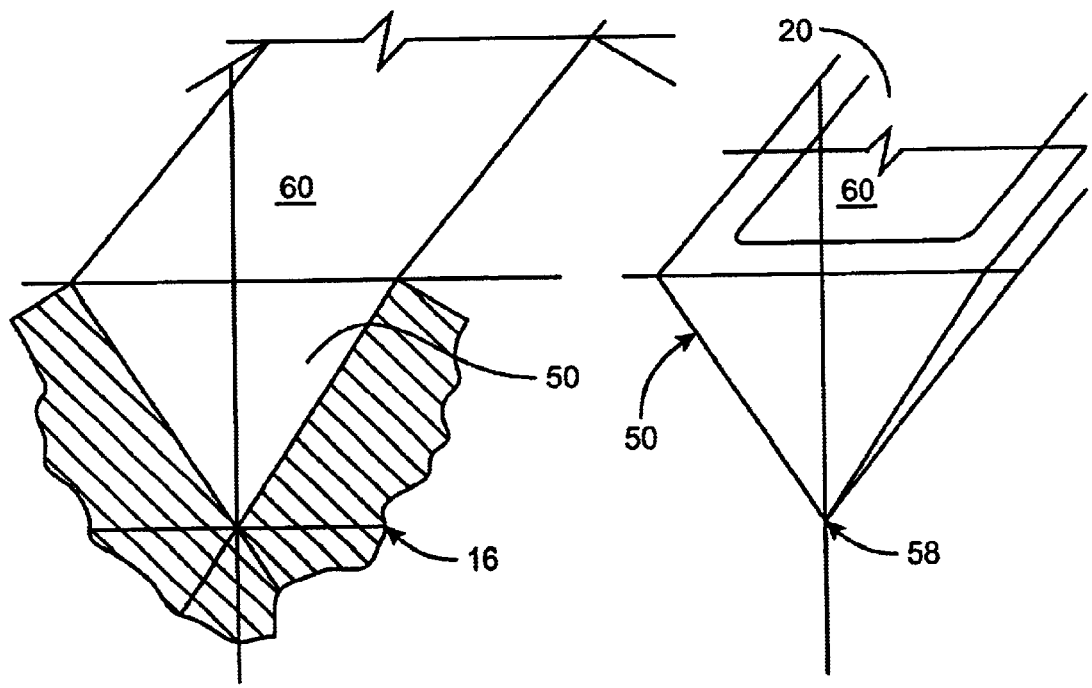
FIGS. 7A and 7B are end views of a single removable, modular unit of the processing apparatus.

Each of the first and second processing apparatuses 16, 16' can include a plurality of nominally independent modular units 50. FIGS. 7A and 7B show one specific embodiment of the present invention in which each modular unit 50 is a detachable unit having a triangular cross section. Each modular unit 50 can be coupled to the remaining assembled modular units so as to form a complete processing unit 16. The most extreme surface from a center of rotation 58 is a processing plane 60. The processing plan can contain an opening to the interior cavity 20 of the single modular unit for purposes of performing various types of mechanical, electrical, and thermal processing, as will be explained in more detail below. In some configurations, the triangular modular units 50 can be coupled to a frame (not shown) of the processing unit 16.

Figure 8A:
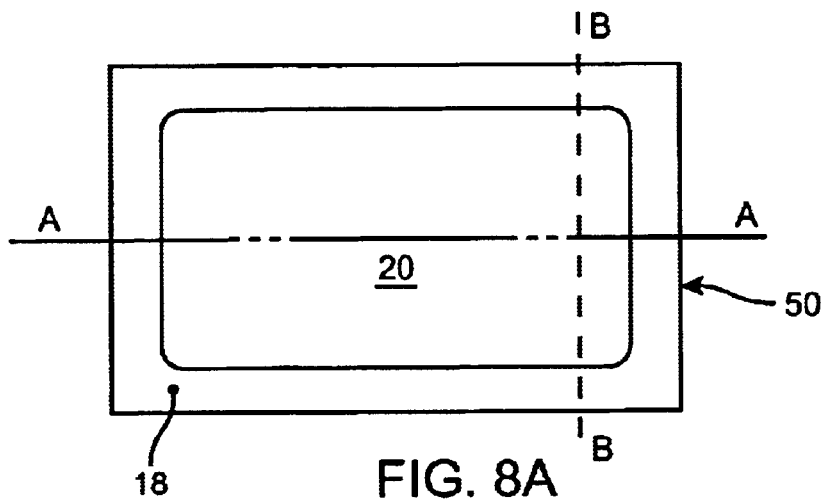
FIG. 8A is a top view illustrating the cavity of the modular unit of FIGS. 7A and 7B.
Figure 8B:
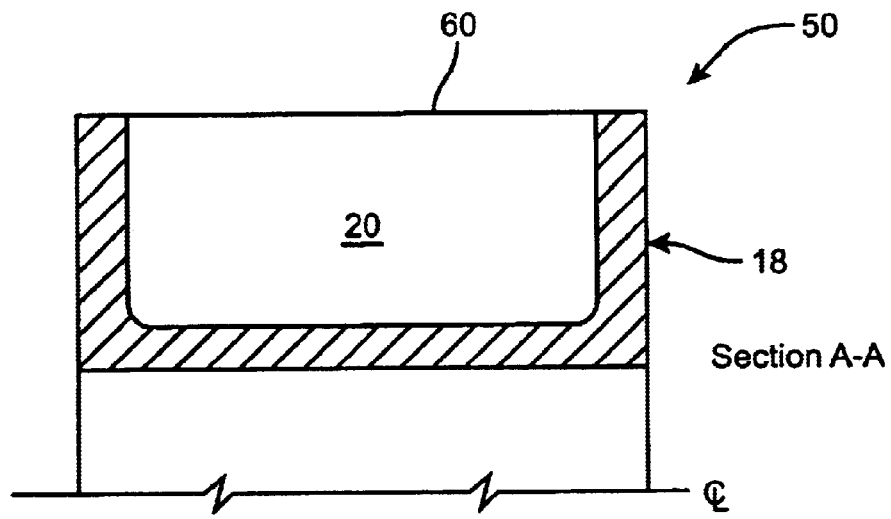
FIG. 8B is a cross sectional view along line A—A of FIG. 8A.

FIGS. 8A and 8B show one embodiment of an individual modular unit that contains a processing cavity 20. The body 18 surrounding the cavity is of size, strength, and thickness as required to perform a particular process. The surface 60 of the modular unit typically comes in contact with the substrate 14. The surface is typically used to form a seal with substrate 14. The seal may only establish nominal contact so as to hold the substrate mechanically or the seal may be have a tighter contact, for example with a detent and protrusion (not shown) so as to enable the creation of a vacuum between the substrate 14 and the cavity 20. In some embodiments, the surface 60 can contact the support 12, a platform 24 or another surface of a second processing apparatus.

Figure 9:
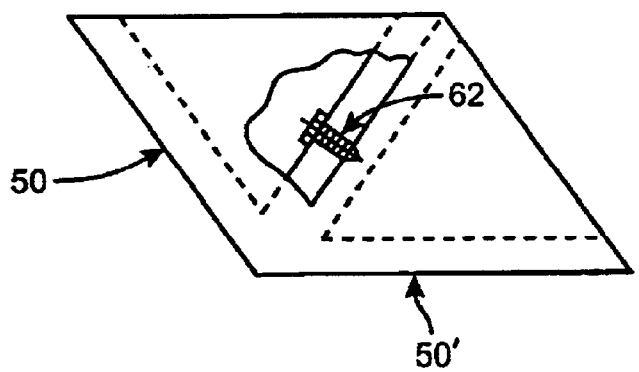
FIG. 9 is an end view of two attached modular units of the processing apparatus.

FIG. 9 shows a side view of two single modular units 50, 50' that are attached via simple mechanical means, in this case, a cap head bolt 62 positioned and size in such a manner so as to not impose itself on an adjacent single modular units. The sides of the modular units 50 may also contain grooves or other mechanical means to achieve a tight and structural attachment of adjacent modular units to form a process assembly 16.

Figure 10A:
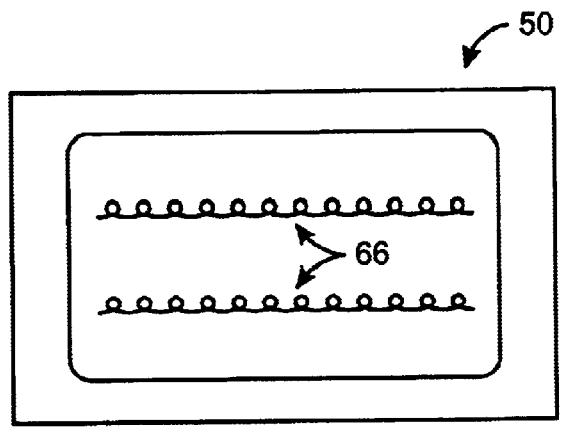
FIG. 10A is a top view of a modular unit comprising heating elements.
Figure 10B:
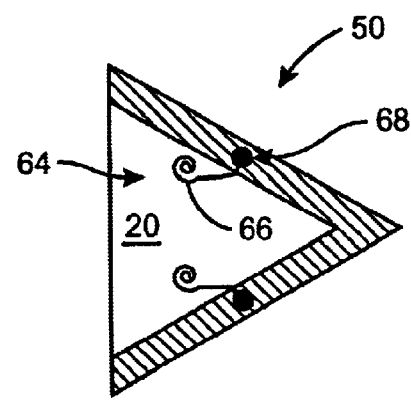
FIG. 10B is a cross-sectional end view of a modular unit comprising heating elements.

As illustrated in FIGS. 10A to 13B, the modular units 50 of the present invention can include a variety of treatment assemblies. For example, as shown in FIGS. 10A and 10B the modular unit can include a thermal assembly 64. The thermal assembly is used to create and deliver heat via convection to one or both sides of the substrate. The thermal assembly 64 can deliver heat through cavity or chamber 20 with one or more heating elements 66 (such as a resistive metal filament) that are connected to an electrical circuit and energy source via a conduit 68. While resistive filaments are illustrated, it should be appreciated that various other conventional or proprietary heating assemblies can be used in the modular units of the present invention. For example, in some processes, by creating a vacuum, heat may be applied purely through radiation.

Figure 11A:
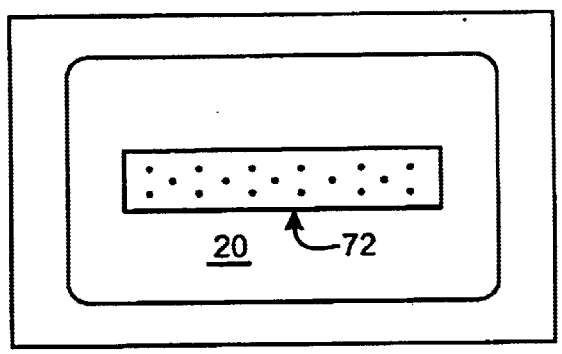
FIG. 11A is a top view of a modular unit comprising a conditioning assembly.
Figure 11B:
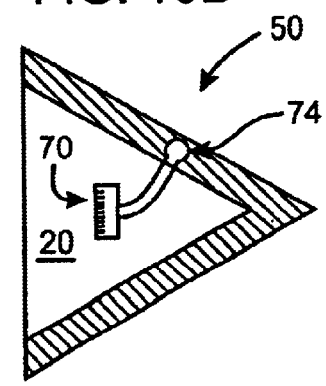
FIG. 11B is a cross sectional end view of a modular unit comprising a conditioning assembly.

FIGS. 11A and 11B illustrate a pre-conditioning assembly 70 that can be used with the modular unit 50 to create a more favorable environment for a subsequent treatments of the substrate. For clarity, a glow discharge process is depicted in which a gas dispersal mechanism 72 is placed within the cavity 20 and a source of gas (nitrogen, argon, etc.) is provided via an access hole and conduit 74 that is connected to the source of gas (not shown). It should be appreciated however, that this is but one example of a pre-conditioning assembly that precedes a vacuum metallization process and other pre-conditioning processes can be incorporated into the modular units 50. Some examples include heating, gas treatment, pre-forming to create a shape that has a desirable pre-stress condition, and the like.

Figure 12A:
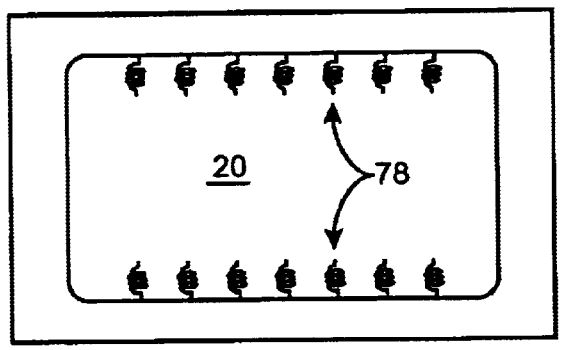
FIG. 12A is a top view of a modular assembly comprising a plurality of filaments and canes.
Figure 12B:
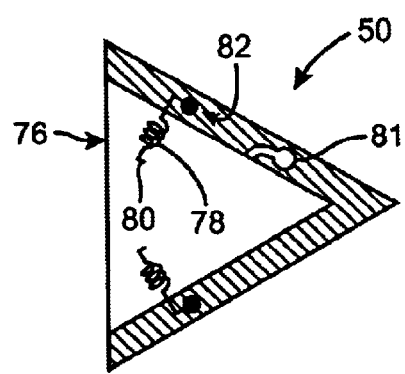
FIG. 12B is a cross-sectional end view of a modular unit comprising a plurality of filaments and canes.

FIGS. 12A and 12B illustrates a metallization assembly 76 used for depositing a metal layer onto the substrate. It should be appreciated that the preconditioning assembly 70 of FIG. 11A and 11B would be contained in the view of FIGS. 12A and 12B, but are omitted for clarity. In a vacuum metallization process, tungsten filaments 78 in various shapes but often of the form of a spring-like spiral with an interior opening sufficient for the placement of L-shaped "canes" 80 are placed around and within the cavity. The tungsten filaments are connected to a source of electrical energy via a conduit 82. A vacuum is created within the cavity using a number of ports 81 that are connected to vacuum source (not shown) having an external array of pumps, blowers, and various other mechanical means for creating a vacuum. The filaments 78 and canes 80 can either be manually placed into the cavity or automated equipment can be used to place the filaments 78 and canes 80 in the metallization assembly 76.

Figure 13:
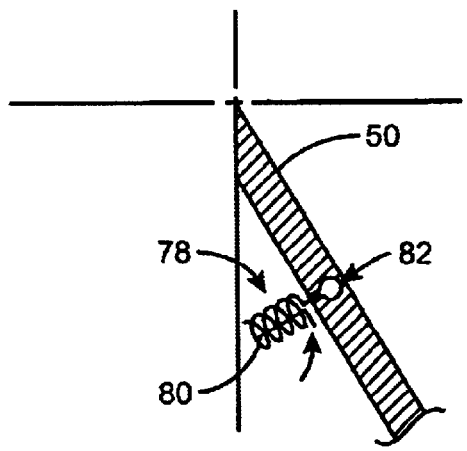
FIG. 13 is a close-up view of a metal cane and a filament.
Figure 14:
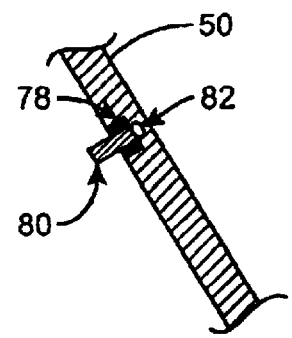
FIG. 14 is a close-up view of another embodiment of a metal cane and a filament.

Two specific arrangements of the canes 80 and filaments 78 are illustrated in FIGS. 13 and 14. In the case of a vacuum metallization process, the assembly of a metal canes 80 and a tungsten filament 78 are placed into the electrical and mechanical interface 82 much like pushing or screwing a light bulb into its socket (FIG. 13). The electrical and mechanical interface 82 includes a conductive interior designed with sufficient mechanical tolerances to allow the tungsten filament 78 to snugly fit and remain in place while at the same time establishing an electrical connection to the power source. The assembly of tungsten filament and metal cane can be placed by hand from time to time as required or it may be placed by any number of automated methods. Alternatively, a long "bar" (not shown) may be pre-assembled in which at regular distances the filament/cane combination is attached to an electrically conductive bar which is, in turn, is mechanical/electrically attached to certain points of the modular unit 50 so as to establish a path for electricity to charge the bar.

As shown in FIG. 14, combination of filament 78 and cane 80 can take any number of geometric configurations in order to properly vaporize and distribute the metal cane. For example, in on alternative configuration, the tungsten filament 78 may be a hollow cylinder 84 that is connected to the mechanical/electrical interface 82 by simply pushing it into a slightly larger cylindrical opening in the modular unit. The cane can be in the shape of a cylinder 86 that is simply pushed into the cylindrical tungsten insert 84. The tungsten insert 84 or any other tungsten filament configuration may be replaced with any suitable material that provides for the rapid generation of heat (via resistance) while retaining mechanical properties necessary for vacuum metallization.

Figure 15:
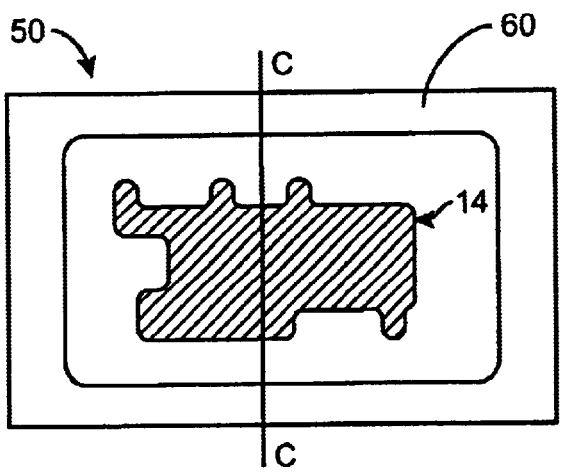
FIG. 15 is a top view of a shaped substrate within the processing zone of the modular unit.
Figure 16:
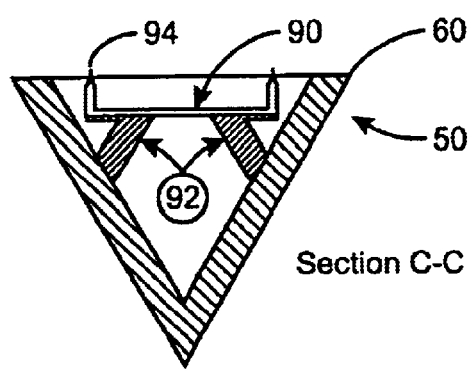
FIG. 16 is a cross-sectional end view illustrating a modular unit comprising a steel-rule die.

FIG. 15 is a top view of a process surface 60 and a shaped substrate 14 located within a process zone and containing an area intended to be cut out (AKA the "part" 88). For a polymer substrate, as shown in FIG. 16, the process can use a mechanical cutting element 90 (e.g., a steel ruled die, or the like) that comes in contact with the substrate 14 and is designed to penetrate the polymer substrate. The cutting element 90 can be attached to the sides of the modular unit 50 via various mechanical means 92. The cutting edge 94, in this case, would exceed the plane 60 of the substrate by an amount necessary to achieve cutting. A corresponding modular unit of the other first or second unit 16' can provide a bearing surface for the cutting edge 94 or an additional cutting element 90 to improve the cutting process.

Figure 17:
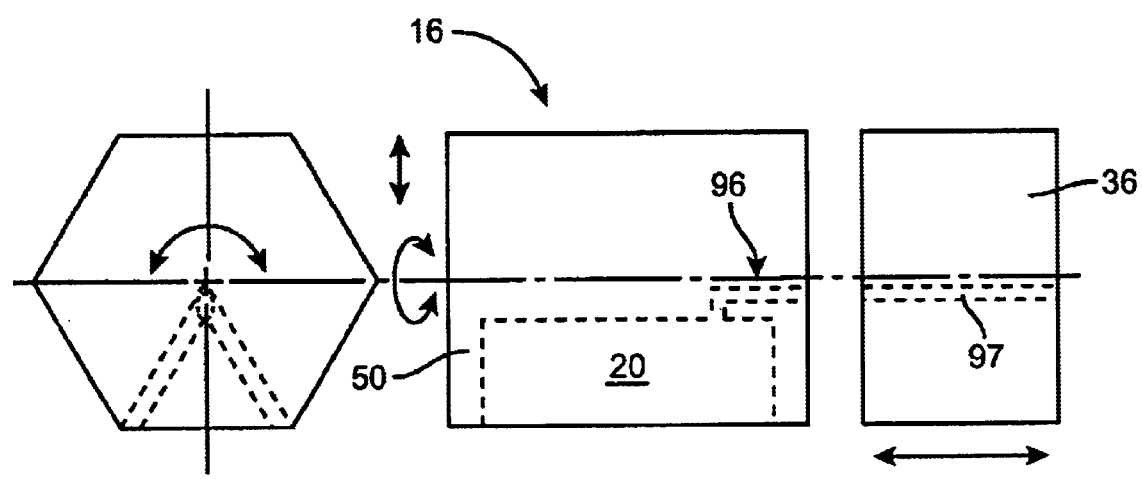
FIG. 17 is a schematic view of a processing system of the present invention.

Each of the modular units 50 will include a number of conduits and ports for coupling the assemblies 64, 72, 76, 90 to their respective sources (e.g. power source, gas source, vacuum source, or the like). FIG. 17 shows a modular unit 50 that has an internal conduits 96 for drawing vacuum, transporting electrical energy, transporting gas, or the like. These internal conduits connect the cavity 20 of the individual modular units 50 to a movable end unit 36 which has corresponding conduits 97 that are connectable to connectors, power supplies, pumps and blowers, etc. needed to provide electricity provide vacuum capabilities, and provide various gases for processing. Various types of connectors considered standard in the mechanical equipment industry provide the connection between the end unit 36 and modular process units 50. As shown by the arrows, the end unit 36 is typically moved laterally with respect to the processing apparatus 16 in order to effect a connection (or disengage a connection) with the conduit 96 of the modular unit 50. This movement is computer controlled to be coordinated with the rotational and linear movement of the processing apparatus 16 such that at the start of a sequence the conduits of the processing apparatuses 16, 16' are aligned the end unit 36. If the processing apparatuses are to be rotated, the end unit 36 can move away from the processing apparatus 16 and disengage its various connections. The upper/lower apparatuses are then raised away from the substrate a sufficient distance to allow the rotation of the processing apparatus to position the new processing unit to become oriented directly above or below the substrate. The substrate can then be moved if a part of an inline continuous process, removed in the case of a sheet process or allowed to stay in place for the next process. The first and second units 16, 16' are then lowered and raised to come in contact with the substrate. The end unit 36 can then be re-engaged with the first and second units 16, 16' to connect the conduit 96 to the desired source.

An exemplary method of the present invention will now be described in relation to the manufacturing of an EMI/RFI shield that is composed of a metallized polymer substrate. In particular, the following method will be in relation to an in-line process of metallizing a thermoform. The thermoform can be automatically or manually roll-fed or sheet-fed into the processing apparatuses of the present invention. A first station is typically a shaping or thermoforming station. Thermoforming is the heating and molding of plastic substrate into a shaped product. The shaped product can take a variety of forms to create an EMI shield. Various EMI shields are described and illustrated in U.S. Pat. No. 5,811, 050 and patent application Ser. Nos. 09/788,263, filed Feb. 16, 2001, entitled "EMI and RFI Shielding for Printed Circuit Boards" (Attorney Docket No. 020843-000200US) and 09/785,975 filed Feb. 16, 2001, entitled "Electromagnetic Interference Shielding of Electrical Cables and Connectors" (Attorney Docket No. 020843-000100US), and PCT application No. 00/27610, filed Oct. 6, 2000, entitled "EMI Containment Apparatus"(Attorney Docket No. 020843-000300PC), the complete disclosures of which are incorporated herein by reference.

The shaping processing apparatus 26 (for example FIG. 3) can use either a vacuum to pull the polymer sheet into the shape of the mold and/or air pressure to force the polymer sheet into the shape of the mold. The present invention can use matched male/female molds (with or without the vacuum and air pressure) to facilitate the molding of the polymer. The thermoforming assemblies 16 can use a variety of heating elements to soften the substrate 14, such as ceramic, quartz tubes, lamps, coils, or the like. In use, the thermoforming assembly 26 is moved to contact the polymer substrate 14. The substrate can be heated to the desired softness or "sag" and can then be formed in the mold on the first and second units. As noted above, if desired, a vacuum can be coupled to one of the first and second modules and a pressure source can be coupled to the other of the first and second modules.

The shaped substrate can then be transported either manually or with a conveyor system 32 to the metallization assembly 28. The metallization assembly 28 can create a vacuum around the desired portion of the substrate and the metal layer can be deposited onto the shaped substrate. Thereafter, the metallized substrate can be moved to the cutting assembly 30 for final processing of the substrate (FIGS. 15 and 16). While not shown, it should be appreciated that a variety of pre-conditioning assemblies 64 and other finishing assemblies can be used to prep and finish the resulting EMI shield.

While all the above is a complete description of the preferred embodiments of the inventions, various alternatives, modifications, and equivalents may be used. For example, while the systems of the present invention are illustrated with the processing unit and substrate in a horizontal position, it should be appreciated that the substrate can be moved in a vertical direction, if desired As will be appreciated by those of ordinary skill in the art, the foregoing description is intended to be illustrative, but not limiting, of the scope of the invention which is set forth in the following claims.

What is claimed is:

1. An in-line apparatus for creating an EMI shield, the apparatus comprising:

a conveyor assembly that moves a substrate;

a vacuum shaping assembly disposed at a first station, the vacuum shaping assembly comprising a vacuum source that pulls the substrate against a surface of a mold to shape the substrate into an EMI shield body, wherein the shaping assembly comprises a first portion disposed on a first side of the substrate and a second portion disposed on a second side of the substrate;

a metallization assembly at a second station that can create a seal around the shaped substrate, wherein the metallization assembly deposits a metal layer onto the shaped substrate; and a cutting assembly disposed at a third station to cut the shaped substrate, the cutting assembly being movable relative to the shaped substrate.

2. The in-line apparatus of claim 1 wherein the metallization assembly comprises:

a movable chamber configured to create a vacuum environment around a portion of the substrate;

a metal source and a thermal heat source that are spaced from the substrate and configured to deposit a metal layer onto the substrate in the vacuum environment, wherein the movable chamber is movable between a first position adjacent the substrate and a second position apart from the substrate.

3. The in-line apparatus of claim 2 wherein the conveyor assembly positions the substrate along a plane, wherein the metallization assembly is rotatable about an axis that is parallel to the plane of the substrate.

4. The in-line apparatus of claim 1 wherein metallization assembly comprises a first and second metallization assembly on opposing sides of the substrate.

5. The in-line apparatus of claim 1 wherein the metallization assembly is modular.

6. The in-line apparatus of claim 1 wherein the metallization assembly comprises a filament and a metal source.

7. The in-line apparatus of claim 1 wherein the metallization assembly is releasably coupled to a movable vacuum source.

8. The in-line apparatus of claim 1 wherein the conveyor assembly positions at least a portion of the substrate along a plane, wherein the shaping assembly, metallization assembly and cutting assembly are movable orthogonal to the plane of the substrate.

9. The in-line apparatus of claim 1 wherein the metallization assembly vacuum metallizes the shaped substrate.

10. The in-line apparatus of claim 1 wherein the vacuum shaping assembly comprises a pre-heating element.

11. The in-line apparatus of claim 1 further comprising an additional cutting station at a fourth station, wherein the fourth station is positioned before the metallization assembly at the second station.

12. The in-line apparatus of claim 1 further comprising an additional cutting station at a fourth station, wherein the fourth station is positioned after the metallization assembly at the second station.

13. An in-line apparatus for creating an EMI shield, the apparatus comprising:

a conveyor assembly that moves a substrate;

a vacuum shaping assembly disposed at a first station, the vacuum shaping assembly comprising a vacuum source that pulls the substrate against a surface of a mold to shape the substrate into an EMI shield body;

a metallization assembly at a second station that can create a seal around the shaped substrate, wherein the metallization assembly deposits a metal layer onto the shaped substrate; and a cutting assembly disposed at a third station to cut the shaped substrate, the cutting assembly being movable relative to the shaped substrate, wherein the conveyor assembly positions at least a portion of the substrate along a plane, wherein the shaping assembly, metallization assembly and cutting assembly are movable orthogonal to the plane of the substrate.

14. The in-line apparatus of claim 13 wherein the metallization assembly comprises:

a movable chamber configured to create a vacuum environment around a portion of the substrate;

a metal source and a thermal heat source that are spaced from the substrate and configured to deposit a metal layer onto the substrate in the vacuum environment, wherein the movable chamber is movable between a first position adjacent the substrate and a second position apart from the substrate.

15. The in-line apparatus of claim 14 wherein the conveyor assembly positions the substrate along a plane, wherein the metallization assembly is rotatable about an axis that is parallel the plane of the substrate.

16. The in-line apparatus of claim 13 wherein metallization assembly comprises a first and second metallization assembly on opposing sides of the substrate.

17. The in-line apparatus of claim 13 wherein the metallization assembly is modular.

18. The in-line apparatus of claim 13 wherein the metallization assembly comprises a filament and a metal source.

19. The in-line apparatus of claim 13 wherein the metallization assembly is releasably coupled to a movable vacuum source.

20. The in-line apparatus of claim 13 wherein the metallization assembly vacuum metallizes the shaped substrate.

21. The in-line apparatus of claim 13 wherein the vacuum shaping assembly comprises a pre-heating element.

22. The in-line apparatus of claim 13 further comprising an additional cutting station at a fourth station, wherein the fourth station is positioned before the metallization assembly at the second station.

23. The in-line apparatus of claim 13 further comprising an additional cutting station at a fourth station, wherein the fourth station is positioned after the metallization assembly at the second station.

* * * * *